United States Patent [19]
Thomsen

[11] Patent Number: 6,151,217
[45] Date of Patent: Nov. 21, 2000

[54] APPARATUS AND METHOD FOR ENABLING HOT PLUGGING OF AN INTEGRATED CIRCUIT

[75] Inventor: Peter Thomsen, Austin, Tex.

[73] Assignee: International Business Machines Corporation, Armonk, N.Y.

[21] Appl. No.: 09/260,281

[22] Filed: Mar. 2, 1999

[51] Int. Cl.$^7$ ................................................ H05K 7/20
[52] U.S. Cl. .................... 361/709; 361/704; 361/707; 361/710; 361/714; 257/706; 257/722; 174/16.3; 165/80.3; 165/104.33; 165/185
[58] Field of Search .................. 361/687–690, 361/694, 695, 697, 703, 704, 707, 719, 720; 257/718, 719, 722; 124/16.3; 165/80.3, 104.33, 185; 29/832

[56] References Cited

U.S. PATENT DOCUMENTS

| | | | |
|---|---|---|---|
| 5,241,453 | 8/1993 | Bright et al. .............................. | 361/704 |
| 5,313,701 | 5/1994 | Klinger et al. ............................. | 29/840 |
| 5,475,261 | 12/1995 | Tanizawa ................................. | 257/693 |
| 5,477,916 | 12/1995 | Lin ........................................ | 165/80.3 |
| 5,761,041 | 6/1998 | Hassanzadeh et al. .................. | 361/704 |
| 5,815,371 | 9/1998 | Jeffries et al. ........................... | 361/704 |
| 5,946,191 | 8/1999 | Oyamada ................................. | 361/700 |
| 5,966,289 | 10/1999 | Hastings et al. ......................... | 361/704 |

FOREIGN PATENT DOCUMENTS 404186752A  7/1992  Japan ............................. H01L 23/40

*Primary Examiner*—Leo P. Picard
*Assistant Examiner*—Boris L. Chervinsky
*Attorney, Agent, or Firm*—Felsman, Bradley, Vaden, Gunter & Dillon, LLP

[57] ABSTRACT

An apparatus for handling an electrical component, such as a CPU module, having a heatsink mounted to an upper surface and a plurality of contact pins is disclosed. The apparatus has a base plate with a central opening, a pair of parallel end plates extending upward from the base plate, and a top plate with a pair of integral air baffles. A set of fasteners are used to mount and retain the component/heatsink assembly within the apparatus. The air baffles are used to deflect air flow through the heatsink. The apparatus also has a handle on the top plate and a guide post on each corner of the bottom plate for handling and pin protection. The component/heatsi&k assembly is mounted in the apparatus before the top plate is attached such that the pins of the component extend through the opening in the base plate. When the assembly is aligned within the apparatus, the fasteners secure the assembly from movement relative to the apparatus. The apparatus/component assembly is then mounted onto a mating socket by aligning the guide posts with holes in the socket. The assembly is pressed into the socket until the pins seat in the socket holes. The apparatus is left installed with the component.

17 Claims, 2 Drawing Sheets

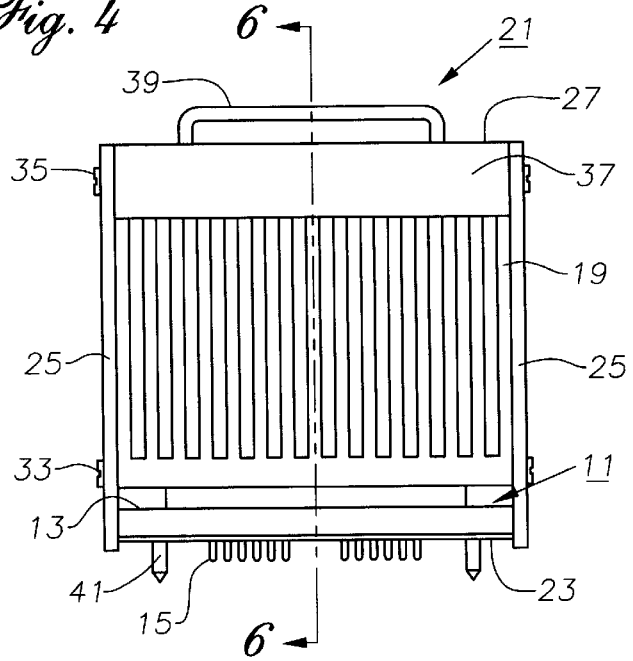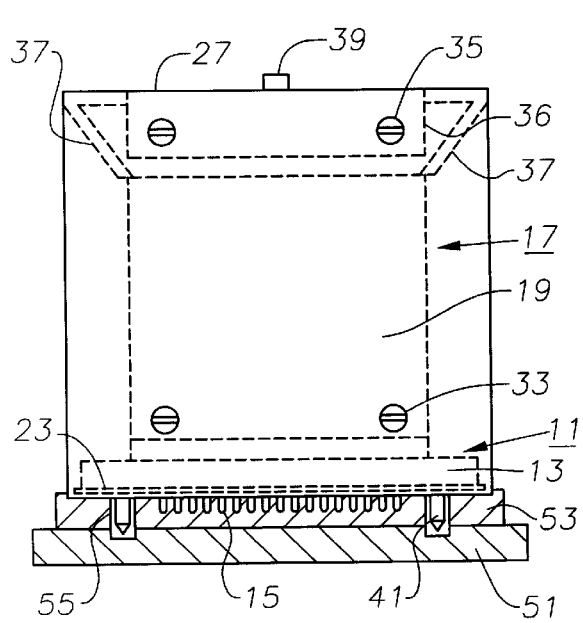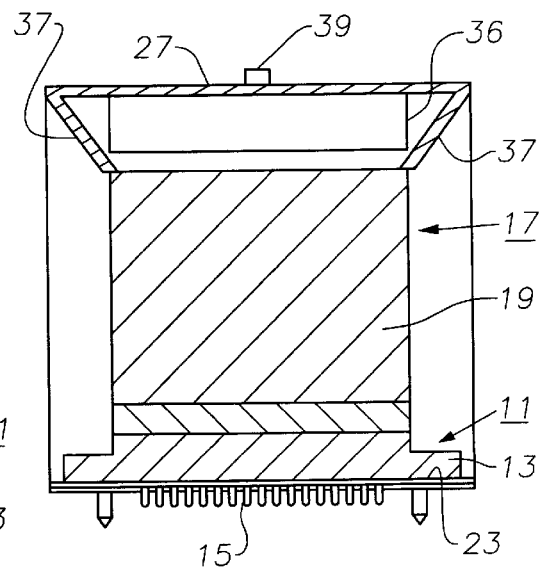

APPARATUS AND METHOD FOR ENABLING HOT PLUGGING OF AN INTEGRATED CIRCUIT

BACKGROUND OF THE INVENTION

1. Technical Field

This invention relates in general to electrical components with pin contacts and in particular to a device and method for hot plugging an electrical component with pin contacts into a socket.

2. Background Art

Electrical components such as modules with pin-in-hole (PIH) packaging, typically have a module body with a plurality of straight, electrical contact pins extending from its lower surface. During the handling and insalation of the module in a mating socket, the pins can be bent or otherwise damaged by incidental contact or by mishandling by unskilled persons In such instances, the module is often permanently damaged and must be discarded. This source of waste can significantly increase manufacturing costs as the module typically represents a relatively expensive portion of the final product.

In some applications, there is also a need for "hot plugging" the component into the socket. Hot plugging refers to inserting the component into the socket either while the socket has power applied to it or while the system it is inserted into is operating. A simple, inexpensive device and/or method for hot plugging a component into a socket while protecting its contact pins is needed.

SUMMARY OF THE INVENTION

An apparatus for handling an electrical component, such as a CPU module, having a heatsink mounted to an upper surface and a plurality of contact pins is disclosed. The apparatus has a base plate with a central opening, a pair of parallel end plates extending upward from the base plate, and a top plate with a pair of integral air baffles. A set of fasteners are used to mount and retain the component/heatsink assembly within the apparatus. The air baffles are used to deflect air flow through the heatsink. The apparatus also has a handle on the top plate and a guide post on each corner of the bottom plate for handling and pin protection.

The component/heatsink assembly is mounted in the apparatus before the top plate is attached such that the pins of the component extend through the opening in the base plate. When the assembly is aligned within the apparatus, the fasteners secure the assembly from movement relative to the apparatus. The apparatus/component assembly is then mounted onto a mating socket by aligning the guide posts with holes in the socket. The assembly is pressed into the socket until the pins seat in the socket holes. The apparatus is left installed with the component.

DESCRIPTION OF THE DRAWINGS

FIG. 4 is a side view of the connector and heatsink assembly of FIG. 2 shown installed in the apparatus of FIG. 3.

FIG. 5 is an end view of the component, heatsink and apparatus assembly of FIG. 4.

FIG. 6 is a sectional end view of the component, heatsink and apparatus assembly of FIG. 4 taken along the line 6—6 of FIG. 4.

BEST MODE FOR CARRYING OUT THE INVENTION

Figure 1:
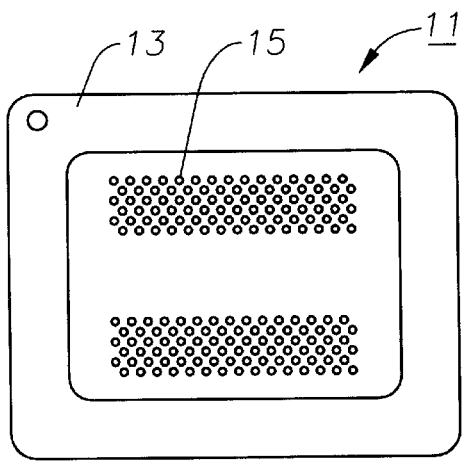
FIG. 1 is a bottom view of an electrical component having pin contacts.
Figure 2:
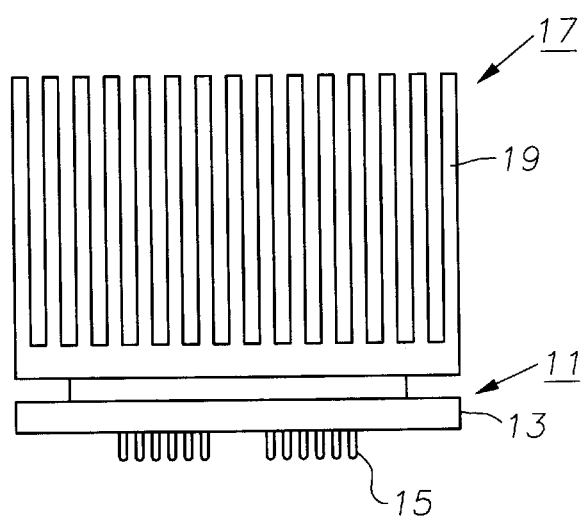
FIG. 2 is a side view of a heatsink mounted on top of the component of FIG. 1.
Figure 3:
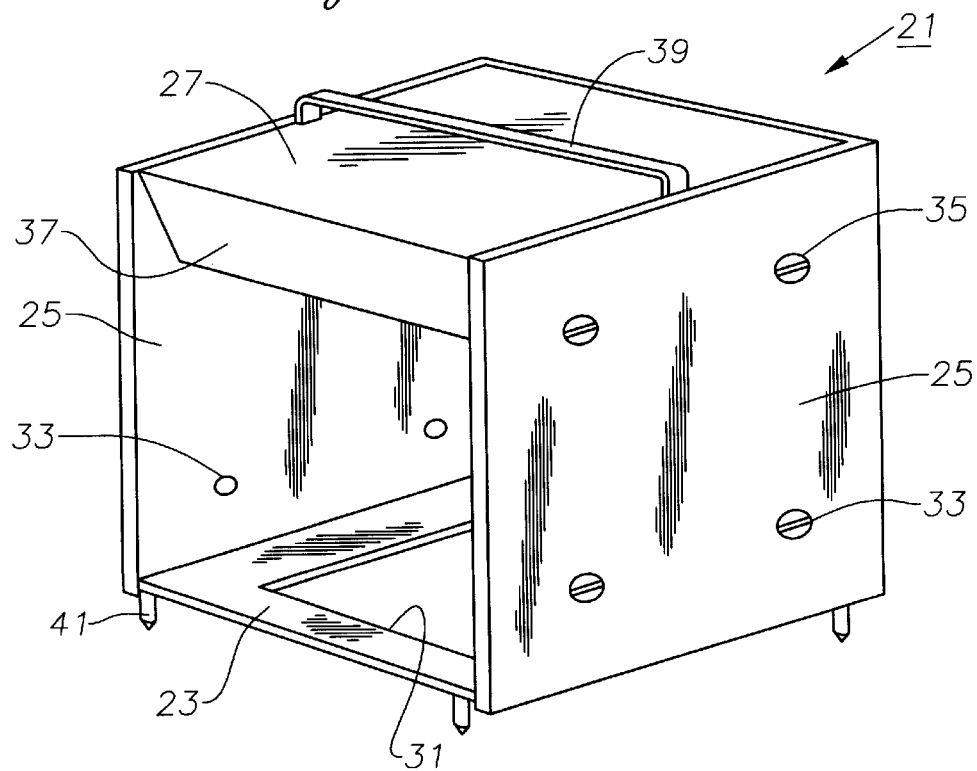
FIG. 3 is an isometric view of an apparatus constructed in accordance with the invention.

Referring to FIGS. 1 and 2, an electrical component 11, such as a CPU module, has a generally rectangular module body 13 and a plurality of straight, electrical contact pins 15 extending from its lower surface. Although component 11 is shown with pin-in-hole (PIH) packaging, component 11 may be formed and sized in many different configurations. A conventional heatsink 17 (FIG. 2) having a plurality of flat, parallel fins 19 is mounted to an upper surface of component 11.

shown in FIG. 3, an apparatus 21 having a generally cubic shape is provided for surrounding and protecting component 11 and heatsink 17. Apparatus 21 comprises a thin-walled frame having a large rectangular opening on each side. Apparatus 21 has a bottom support plate 23, a pair of upright, parallel end walls 25, and a top plate 27 which is parallel to bottom support plate 23. These elements may be formed from spring steel, sheet metal, plastic or other materials. Bottom support plate 23 has a large, central rectangular opening 31 for accommodating pins 15 of component 11. Each end wall 25 has a pair of a attachment screws 33 near its lower end, and a pair of air baffle screws 35 near its upper end. Each screw 33,35 is inserted through a threaded hole in one of end walls 25. As shown in FIGS. 4 and 5, screws 33 engage and retain a base portion of heatsink 17 within apparatus 21. Screws 35 are provided for engaging and retaining a folded end wall 36 on each side of top plate 27. Top plate 27 has an integral air deflection feature or baffle 37 at each end. Each air baffle 37 has a downward inclined cross-section for de-Recting air flow toward and into heatsink 17. The lower edges of air baffles 37 engage fins 19 near their upper ends and along their outer surfaces to secure the connector/heatsink assembly within apparatus 21. Apparatus 21 also has a handle 39 mounted to the upper surface of top plate 27. A guide post 41 extends from the lower surface of each corner of bottom plate 23. Guide posts 41 are short, cylindrical members with pointed ends. Note that guide posts 41 extend from bottom plate 23 for a distance which is greater than the distance that pins 15 extend beneath bottom plate 23.

In operation (FIGS. 4–6), the component a heatsink assembly FIG. 2) is loaded into apparatus 21 before top plate 27 is attached. As the component/heatsink assembly is placed in apparatus 21, the pins 15 of component 11 are carefully extended through central opening 31 without contact. As shown in FIG. 4, the side edges of body 13 abut the inner surfaces of end walls 25 to ensure proper alignment of pins 15 relative to guide posts 41. Top plate 27 is placed on top of heatsink 17 and apparatus 21 so that air baffles 37 closely abut their outer edges (FIG. 6). When the component/heatsink assembly is aligned, the four screws 33 are tightened to secure the assembly from movement relative to apparatus 21. The four screws 35 are then tightened against end walls 36 to secure top plate 27 and the upper end of heatsink 17 from movement relative to apparatus 21.

The assembly of component 11 and apparatus 21 is now ready to be mounted onto an electrical receptacle FIG. 5) such as printed circuit board 51 or a mating socket 53 on PCB 51. The assembly may be hot plugged while the system is running by inserting component 11 into the receptacle. If the receptacle is socket 53, socket 53 will not have power applied to it during this time. The pointed tips of guide posts 41 are placed in alignment holes 55 in an upper surface of socket 53. Guide posts 41 touch and align with holes 55 before pins 15 come into contact with the pinholes in socket 53. The assembly of apparatus 21 and component 11 is pressed into socket 53 until pins 15 seat in the pinholes in socket 53 and PCB 51. When installation of component 11 in socket 53 is complete, bottom plate 23 abuts the upper surface of socket 53 and apparatus 21 will be left permanently installed with component 11. End walls 25 are parallel to the fins 19 of heatsink 17 and air baffles 37 direct airflow through apparatus 21 and fins 19 of heatsink 17.

The invention has several advantages. This simple, inexpensive device allows hot plugging of modules while the associated system is running. The device is easy to handle and provides room for the modules heatsink. The device also has an integrated air baffle and allows unskilled persons to install even expensive components with less likelihood of damaging the component.

While the invention has been shown or described in only some of its forms, it should be apparent to those skilled in the art that it is not so limited, but is susceptible to various changes without departing from the scope of the invention.

I claim:

1. An apparatus, comprising in combination:

an electrical component having a plurality of electrical contact pins extending therefrom;

a heatsink mounted to the component;

a frame mounted to and surrounding the component and the heatsink, wherein the contact pins of the component extend through an opening in the frame; and a guide member mounted to and extending from the frame beyond the contact pins, wherein the guide member is adjacent to but free of contact with the contact pins, and wherein the guide member is adapted to align the frame and the contact pins with a mating electrical device.

2. The apparatus of claim 1 wherein the frame has four corners, and wherein the guide member comprises a post in each corner of the frame.

3. The apparatus of claim 1 wherein the frame has a bottom plate, a pair of end walls and a top plate, the bottom plate having an opening for accommodating the contact pins of the component which extend through the opening.

4. The apparatus of claim 1, further comprising an air deflection feature mounted to the frame in engagement with the heatsink.

5. The apparatus of claim 4 wherein the air deflection feature comprises an air baffle integrally formed on each side of the frame.

6. The apparatus of claim 1 wherein fasteners extend through the frame to secure the component and the heatsink to the frame.

7. The apparatus of claim 1 wherein the frame comprises an enclosure having an internal compartment for containing the component and the heatsink, and an exterior from which the guide member extends.

8. The apparatus of claim 1, further comprising a handle mounted to the frame.

9. The apparatus of claim 1 wherein the frame comprises two end walls and two side openings.

10. An apparatus for protecting an electrical component having contact pins extending therefrom and a heatsink affixed thereto, comprising:

a base having an opening which is adapted to receive contact pins on an electrical component with the contact pins extending beyond the base in a first direction;

a pair of parallel end walls extending from the base;

a top mounted to the end walls opposite the base;

guide member mounted to and extending from the base in the first direction, the guide member being adapted to align the apparatus and contact pins with a mating electrical device; and wherein the base, the end walls and the top define an enclosure for retaining the component and the heatsink therein, such that the component can be hot plugged into the electrical device.

11. The apparatus of claim 10 wherein the base has four corners, and wherein the guide member comprises a post in each corner.

12. The apparatus of claim 10, further comprising an air deflection feature integrally formed on each side of the top for engagement with the heatsink.

13. The apparatus of claim 10, further comprising a set of fasteners for securing the component and the heatsink to the frame.

14. The apparatus of claim 10 wherein the base, end walls and top define an enclosure having two side openings for allowing airflow through the heatsink.

15. The apparatus of claim 10, further comprising a handle mounted to the top.

16. A method of hot plugging an electrical component having contact pins and a heatsink into an electrical device having a set of pin holes which receive the contact pins, comprising:

(a) providing an enclosure with a guide member and an opening for accommodating the contact pins of the component;

(b) mounting the component inside the enclosure with the contact pins extending through the opening such that the guide member protects the contact pins from incidental contact with other objects;

(c) positioning the assembly of step (b) on the electrical device such that the guide member engages with an alignment feature on the electrical device; then (d) pressing the assembly toward the electrical device such that the contact pins enter the pin holes in the electrical device.

17. The method of claim 16 wherein the guide member engages the alignment feature before the contact pins touch the pin holes.

* * * * *